United States Patent [19]
Rashid et al.

[11] Patent Number: 5,523,972
[45] Date of Patent: Jun. 4, 1996

[54] METHOD AND APPARATUS FOR VERIFYING THE PROGRAMMING OF MULTI-LEVEL FLASH EEPROM MEMORY

[75] Inventors: Mamun Rashid, Davis; Mark Bauer, Cameron Park; Chakravarthy Yarlagadda, Citrus Heights; Phillip M. L. Kwong, Folsom; Albert Fazio, Los Gatos, all of Calif.

[73] Assignee: Intel Corporation, Santa Clara, Calif.

[21] Appl. No.: 252,831

[22] Filed: Jun. 2, 1994

[51] Int. Cl.⁶ .................................................. G11C 29/00
[52] U.S. Cl. .............................. 365/185.22; 365/185.33; 365/189.07; 365/201
[58] Field of Search .................................... 365/185, 900, 365/201, 189.07

[56] References Cited

U.S. PATENT DOCUMENTS

5,287,317  2/1994  Kobayashi et al. ............... 365/185 X
5,293,610  3/1994  Schwarz ............................. 365/185 X

*Primary Examiner*—Do Hyun Yoo
*Attorney, Agent, or Firm*—Blakely, Sokoloff, Taylor & Zafman

[57] ABSTRACT

A programming verify circuit for controlling the memory cells to which programming voltages are applied, the circuit including a comparator for testing the state of each cell being programmed with the state to which the cell is being programmed, and a program load circuit which responds to the result of the test by the comparator to hold a condition for each memory cell being programmed to indicate whether the memory cell should be further programmed, each program load circuit including circuitry for precluding the holding of a condition indicating further programming is necessary once the associated memory cell has been initially verified as programmed by the comparator.

20 Claims, 6 Drawing Sheets

METHOD AND APPARATUS FOR VERIFYING THE PROGRAMMING OF MULTI-LEVEL FLASH EEPROM MEMORY

BACKGROUND OF THE INVENTION

1. Field of the Invention

This invention relates to computer systems, and more particularly, to methods and apparatus for programming flash EEPROM memory cells which store a plurality of bits of data.

2. History of the Prior Art

Recently, flash electrically-erasable programmable read only memory (flash EEPROM memory) has been used as a new form of long term storage. A flash EEPROM memory array is constructed of floating gate field effect transistor devices. Such memory transistors may be programmed by storing a charge on the floating gate. The charge level (programmed or erased) may be detected by interrogating the cells. An example of a flash EEPROM memory array which may be used in place of a hard disk drive is given in U.S. patent application Ser. No. 07/969,131, entitled *A Method and Circuitry For A Solid State Memory Disk,* S. Wells, filed Oct. 31, 1992, and assigned to the assignee of the present invention. These arrays provide a smaller lighter functional equivalent of a hard disk drive which operates more rapidly and is not as sensitive to physical damage. Such memory arrays are especially useful in portable computers where space is at a premium and weight is extremely important.

Recently, it has been discovered that the transistor devices used for flash EEPROM memory arrays may be made to store more than two charge levels. Essentially, four or more distinct levels of charge may be stored on the floating gate of the devices by varying the voltages applied to the terminals of the devices during programming; and these different charge levels (conditions or states) may be detected. This allows flash EEPROM devices in memory arrays to store more than one bit per device and radically increases the storage capacity of such arrays.

Flash EEPROM memory arrays, like other transistor memory arrays utilize reference devices to store values against which the memory cells are tested to determine their charge level when the memory cells are read. These reference devices are typically flash EEPROM devices similar to those used for storing data in the array. In a typical prior art memory array in which two possible charge levels are available for each memory cell, the reference devices are programmed to a charge level to produce a particular current value when interrogated which is midway between the two charge levels in which the memory cells may be placed. The current through the reference device in turn produces a voltage which is measured against a voltage produced by current through a memory cell.

With the new storage arrangements in which more than one bit may be stored by each memory transistor, many more reference cells are utilized since many more levels must be tested to determine a value stored by the floating gate of a memory cell. Since a number of voltage levels must be measured, the values stored by the reference cells need to be very accurately determined.

A number of problems arise in utilizing these multiple bit memory cells because of the more restricted range of charges which provide each output state. For example, in order to program the cells, an algorithm is utilized which provides a first high level of voltage to the gate terminals of a number of the memory transistors being programmed for a prescribed interval. This initial voltage pulse moves the memory transistors into their saturation range of operation in which they may be controlled more closely. The initial pulse is followed by shorter pulses of incrementally higher voltage which gradually increase the charges on the floating gates and move the devices to the appropriate charge levels. After each of these pulses, the condition of each memory cell being programmed is verified.

Once at a desired charge level, some charge leakage may occur. It is possible for a device to have reached a proper state, lose some charge, and when later tested fail to verify as being in the proper state even though the device is still within an appropriate charge range for correct operation. Since the charging algorithm would apply a voltage which had been incremented to a relatively high level to the gate of any device which did not verify, it should not be utilized with a device in a state just slightly below the verify charge level.

A second problem is caused because of the physical differences in memory devices. Statistically, some devices differ from others. They may have longer or wider channels or other characteristics which differ. Because of this, some devices charge rapidly while others charge slowly. If a device which charges rapidly is being charged to the highest charge level, it may charge to a condition at which the device may be damaged through the repeated charging and discharging inherent in programing and erasing. Consequently, it is necessary to eliminate this overcharging problem so that the faster charging devices and thus the memory array will not fail rapidly in use.

A third problem is caused by the software method by which the verify operations have been accomplished in the prior art; these have been relatively time consuming operations when even a single bit is to be stored for each memory cell. The verify operation becomes very complicated and quite slow when applied to multi-level memory cells. Consequently, an improved method of verifying the programming of multi-level memory cells is desirable.

SUMMARY OF THE INVENTION

It is, therefore, an object of the present invention to provide an improved method and apparatus for programming and rapidly verifying the programming of the memory cells used in flash EPROM memory arrays.

It is another, more specific, object of the present invention to provide apparatus and a method for eliminating the application of programming pulses to memory devices which have been properly programmed but fail to verify because of a loss of charge.

It is another, more specific, object of the present invention to eliminate the ability of memory cells to overcharge during programing operations.

These and other objects of the present invention are realized in a programming verify circuit for controlling the memory cells to which programming voltages are applied, the circuit including a comparator for testing the state of each cell being programmed with the state to which the cell is being programmed, and a program load register which responds to the result of the test by the comparator to hold a condition for each memory cell being programmed to indicate whether the memory cell should be further programmed, each program load register including circuitry for precluding the holding of a condition indicating further programing is necessary once the associated memory cell has been initially verified as programmed by the comparator.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
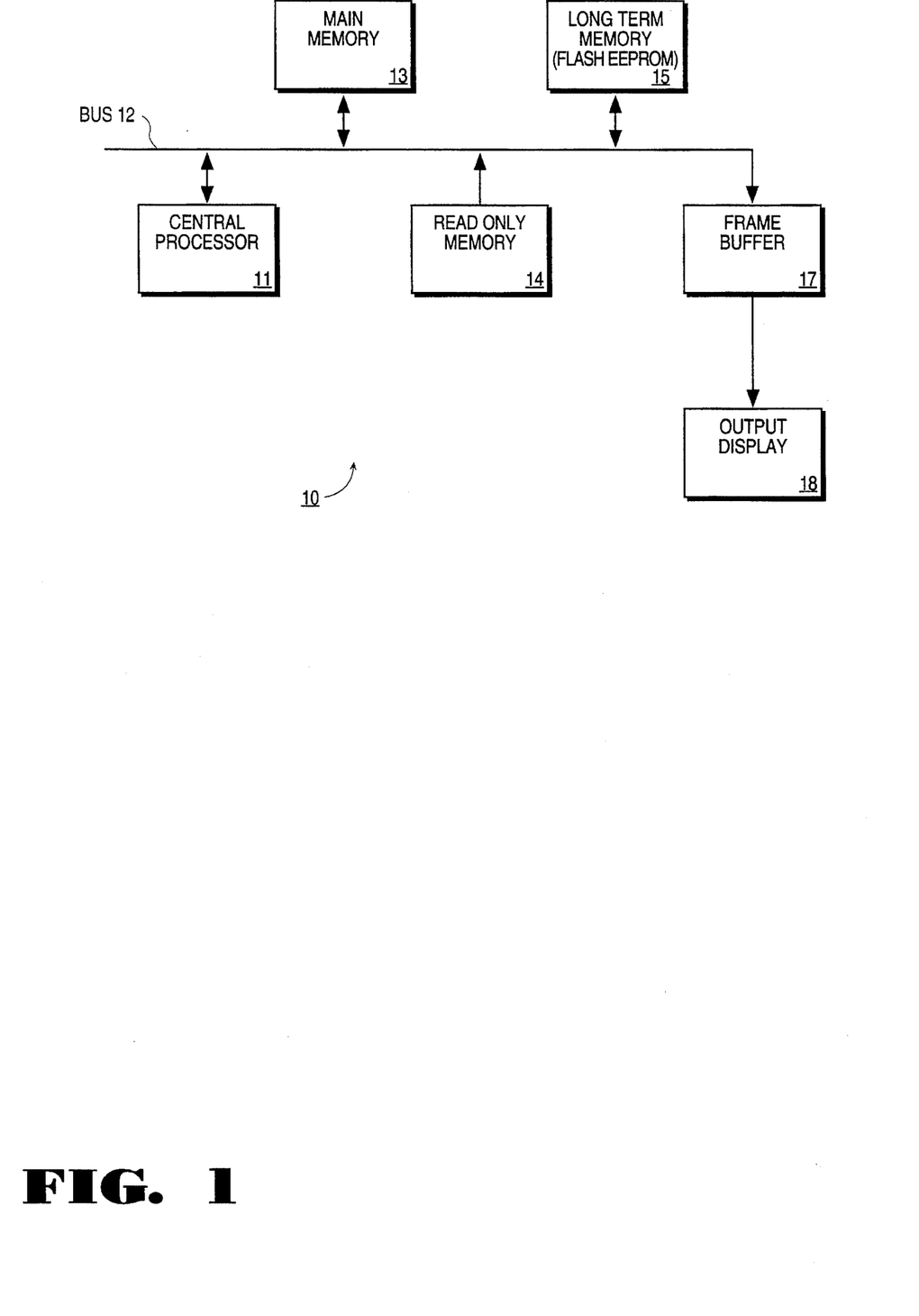
FIG. 1 is a block diagram of a computer system which may include the present invention.

Referring now to FIG. 1, there is illustrated a system block diagram configured in accordance with one embodiment of the present invention. The present invention has application for use in any system utilizing a multi-level memory (a memory in which any memory cell may store more than one binary bit), such as a computer system. A portion of such a computer system 10 includes a central processing unit 11 which executes the various instructions provided to control the operations of the computer system 10. The central processing unit 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also connected to the bus 12 are various peripheral components such as long term memory 16 and circuitry such as a frame buffer 17 to which data may be written which is to be transferred to an output device such as a monitor 18 for display. Rather than the electro-mechanical hard disk drive which is typically used for long term memory, a flash EEPROM memory array may be used as the long term memory 16. Such flash EEPROM memory arrays may be multi-level memory systems which include circuitry for controlling the operation of the memory array including all of the operations associated with programming and erasing the memory array.

Figure 2:
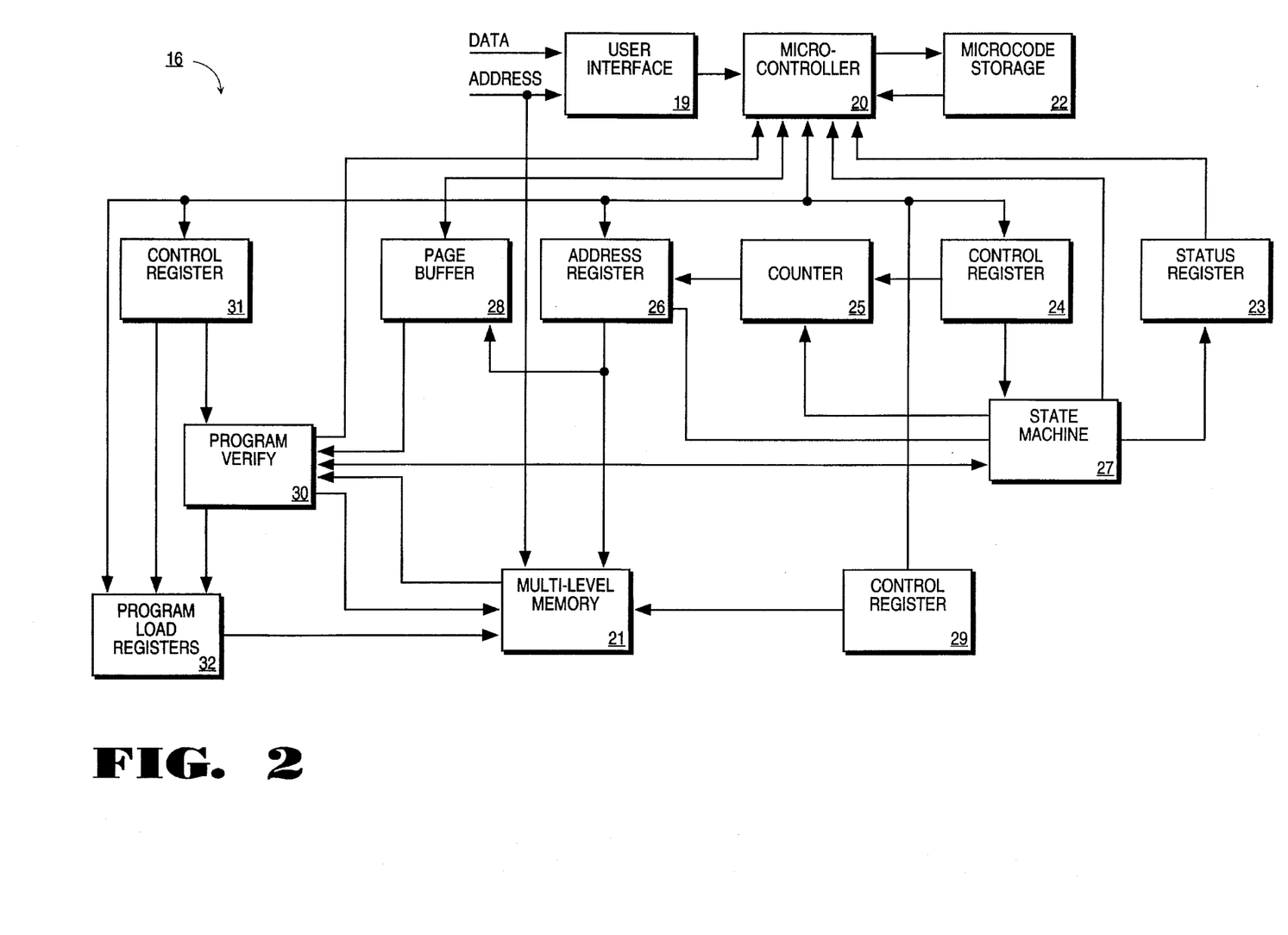
FIG. 2 is a block diagram of a long term memory utilizing a flash EEPROM memory array.

FIG. 2 illustrates in block diagram form a portion of a memory system 16 such as that illustrated in FIG. 1. The memory system 16 is joined to the bus 12 by a user interface 19. The user interface 19 provides signals from the bus 12 to a microcontroller 20 which provides the necessary operations to control a multi-level memory 21. In one embodiment, the microcontroller 20 and multi-level memory 21 are located with the other elements of the memory system 16 on a single integrated circuit die. The microcontroller 20 is associated with a microcode storage device 22 which may store instructions used by the microcontroller 20 for controlling the operation of the memory system 16.

Associated with the microcontroller 20 are a status register 23 which provides data regarding the state of the state machine 27; a state machine 27 which controls various operations of the system 16 such as one of which is controlling the program verify circuit during the verify stage of programming the multi-level memory 21; and a control register 24, counter 25, and address register 26 used for implementing the operations of the state machine 27 and the microcontroller 20 including addressing the memory 21. The system 16 also includes a page buffer 28 used in writing large amounts of data to the memory 21 and a control register 29 used with the memory 21 for controlling its operations. The system 16 also includes a program verify circuit 30, an associated control register 31, and a set of program load registers 32.

In operation, the microprocessor 11 generates commands to program, erase, and read the cells within the multi-level memory 21. Through use of the command structure, the microprocessor 11 specifies the type of operation (e.g. read, program/verify, erase/verify) and an address specifying the multilevel memory cells for the operation. The microcontroller 20 receives the commands from the microprocessor 11 and itself causes or directs the state machine 27 to execute the specified operation in the multilevel memory 21. The microcontroller 20 generates the necessary timing, control, and address operations for associating the memory 21 with the microprocessor 11. The above-mentioned patent application entitled *A Method and Circuit For A Solid State Memory Disk,* provides a further description of an arrangement for controlling the operation of a flash EEPROM memory array.

Figure 3:
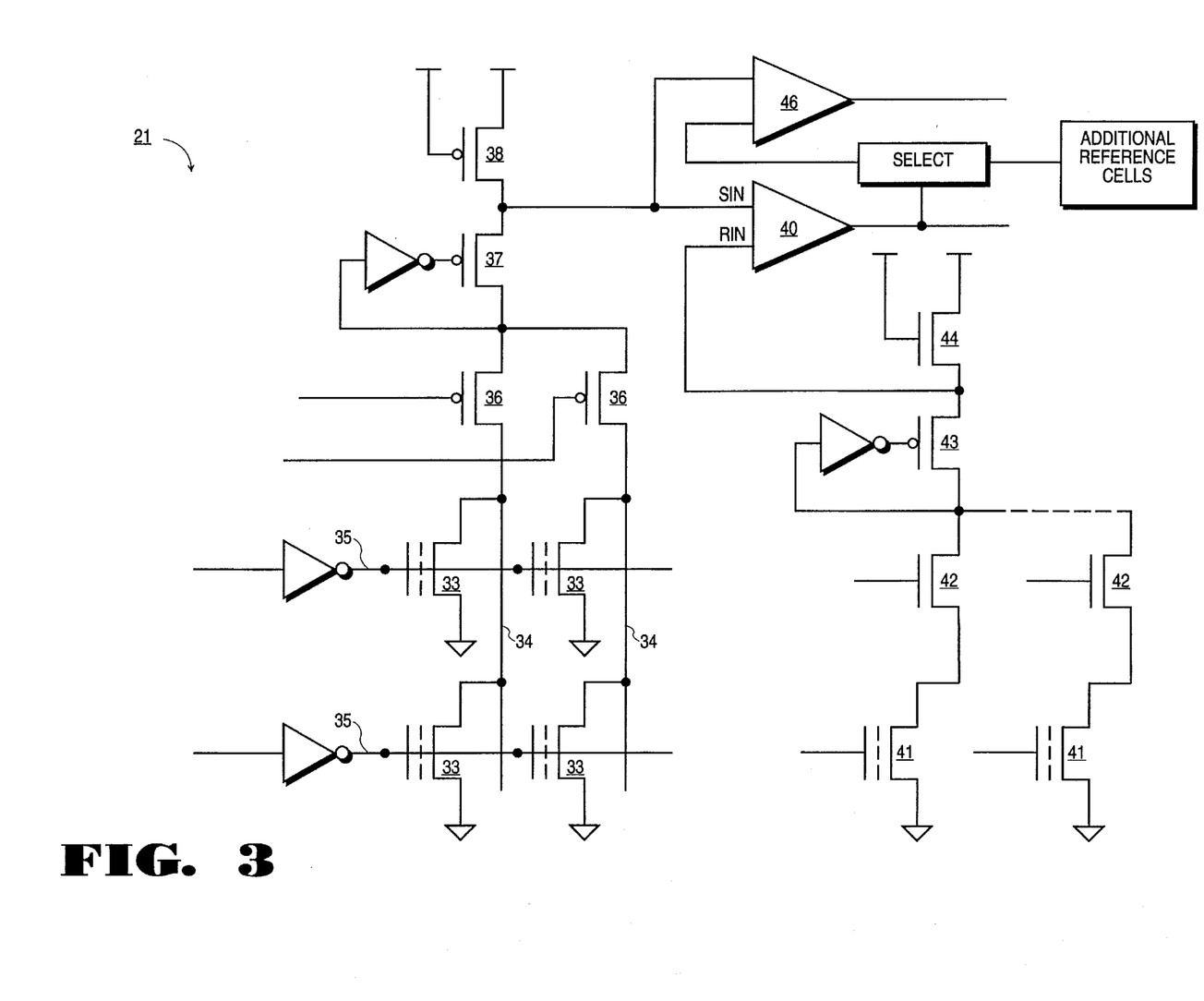
FIG. 3 is a circuit diagram of a flash EEPROM memory array which may be used in the memory of FIG. 2.
Figure 4:
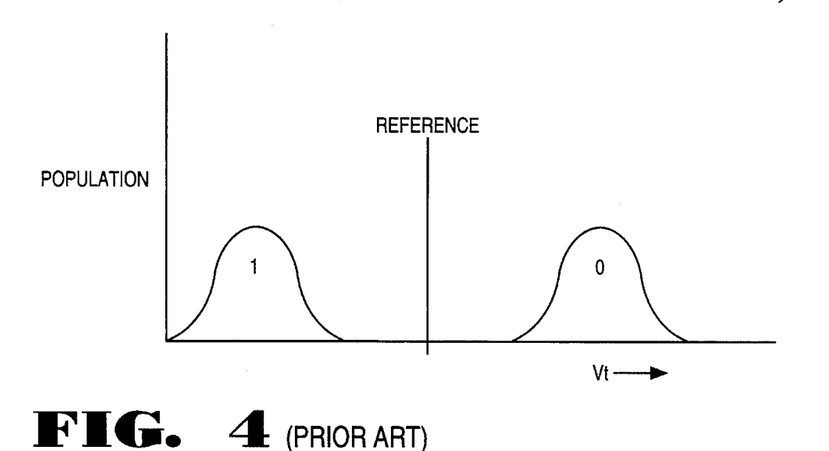
FIG. 4 is a diagram illustrating voltage/population characteristics of flash EEPROM memory transistors in the array of FIG. 3 utilized in accordance with the prior art.
Figure 5:
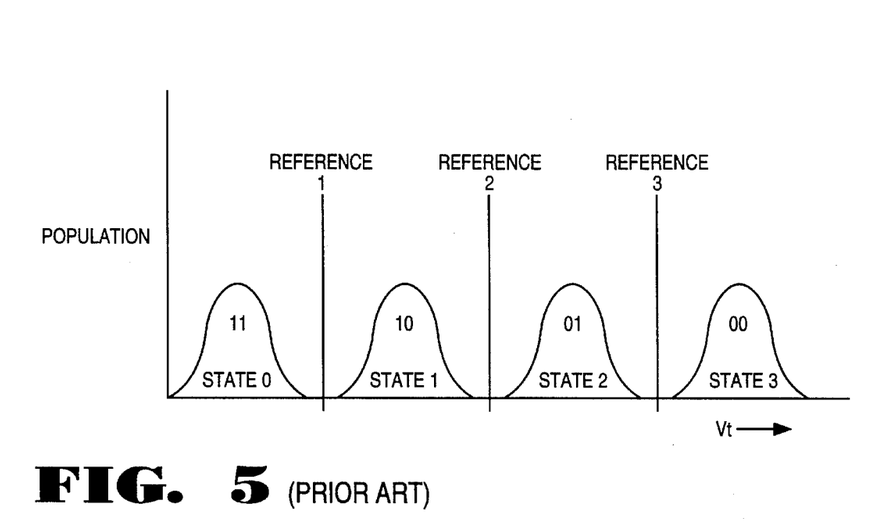
FIG. 5 is a diagram illustrating voltage/population characteristics of flash EEPROM memory transistors in the array of FIG. 3 utilized in accordance with the prior art.

A flash EEPROM memory array such as the memory 21 is constructed of floating gate field effect transistor devices. Such memory transistors may be programmed to change the charge stored on the floating gate, and the charge level (programmed or erased) may be detected by interrogating the cells. FIG. 3 illustrates a portion of a typical flash EEPROM memory array. As may be seen in FIG. 3, the array 21 includes a plurality of floating gate field effect transistor devices 33 arranged in rows and columns. Although not shown in detail, circuitry is provided for addressing any particular device 33 by selecting a particular row and column. Typically, a N type device 33 is erased (placed in a one condition) by applying a value such as twelve volts to the source terminal while grounding the gate terminal and floating the drain terminal. When a device is erased, any charge on the floating gate is tunneled from the floating gate. A device 33 is selectively placed in the zero or programmed condition by placing approximately twelve volts on the gate terminal, approximately seven volts on the drain terminal, and ground on the source terminal. The state of a device 33 is read by detecting the charge on the floating gate. This is accomplished by placing approximately five volts on the gate terminal, a bias voltage through a cascode device on the drain terminal, and grounding the source terminal. As is shown in FIG. 4 which illustrates the population of devices 33 having particular threshold voltages in the erased and programmed conditions, when a device 33 is functioning within tolerances, the gate-source voltage is greater than the threshold voltage Vt of the erased cells and is less than the threshold voltage Vt of the programmed cells. Thus, a device 33 which has been programmed with a substantial charge on the floating gate conducts less current while a device which has been erased will transfer a substantially greater amount of current.

In order to determine the level of charges which are stored by the floating gates of each of the memory transistors in a flash EEPROM array, reference devices are utilized. These reference devices are floating gate field effect transistor devices essentially identical to the memory transistors. The reference devices are programmed to precise values by placing charges on the floating gates. When the memory cells are read, the value of the charge stored by each memory transistor is tested against the value of the charge stored by the reference cells to determine the charge level (state) of the memory cell. In a typical flash EEPROM memory array in which only two possible charge levels are available for each memory cell, the reference devices are programmed to states midway between the programmed and erased states of the memory cells to produce a particular value when interrogated. As FIG. 4 demonstrates, there is a large range between the two states of the memory cells and thus a large margin for error.

In FIG. 3, a typical arrangement of memory transistors 33 for reading memory cells is illustrated. As may be seen, each memory transistor 33 has its gate terminal joined to a wordline 35, its source terminal connected to ground, and its drain terminal connected to a bitline 34. A N type FET transistor device 36 is arranged as a column select device to allow any particular column of devices 33 to be selected. The drain terminals of the devices 36 are joined through a N type device 37 connected in a cascode arrangement to provide drain bias for the devices 33. The drain terminal of the device 37 is connected to a N type load device 38 joined to Vcc. When five volts is applied to the gate terminal of a particular device 33 in a selected column, that device 33 transfers current if five volts is greater than the threshold voltage Vt produced by the charge stored on its floating gate and does not transfer a current if five volts is less than the threshold voltage Vt. If the device 33 transfers current, this current causes voltage drops across the device 37 and the load device 38. The voltage at the drain terminal of the device 38 is furnished to one input of a sense amplifier 40. The sense amplifier 40 receives at its other input a voltage generated in response to a current through a reference transistor 41 arranged in a similar current path with devices 42, 43, and 44 which are chosen to be identical to the devices 36, 37, and 38. If the current through the device 33 being read is greater than the current through the reference device 41, the sense amplifier 40 produces one output signal. If the current through the device 33 being read is less than the current through the reference device 41, the sense amplifier 40 produces a different output signal.

In prior art arrangements, the levels to which the memory transistors 33 are programmed are typically quite widely separated as is illustrated in FIG. 4. Because of this, the memory cell programming need not be too accurately controlled.

In contrast to the prior art arrangements in which only two charge levels are stored on each memory transistor, with the new multi-level arrangements in which more than one bit may be stored by each memory transistor 33, many more reference cells are utilized since many more levels must be tested to determine a value stored by the floating gate of a memory cell. Since a number of levels must be measured and the boundaries between the levels of charge are relatively narrow, the values stored by the reference cells need to be very accurately determined in the new arrangements.

In FIG. 3, in order to allow the storage of more than one bit by each memory cell, a plurality of reference devices 41 are connected so that each may be joined through a selection device 42 and a cascode device 43 to a reference column load device 44. The different reference devices 41 may have their floating gates programmed to different levels to allow the value of the charge stored on any device 33 to be tested against such different reference levels. Each of these reference devices 41 is connected in the same manner. By enabling a particular device 42, the desired one of the reference devices 41 may be connected so that the voltage produced by the current through it may be used at the RIN terminal of the sense amplifier 40.

In one multi-level array embodiment using four different levels of charge, each level of charge which may be placed on the memory cells designates two different bits. In order to allow the memory cells to be used with both single bit and multiple bit storage, those states have been designated 11, 10, 01, and 00. Thus, an erased cell represents a 11 charge level, a cell with a slightly higher threshold voltage represents 10, a cell with an even higher threshold voltage represents a 01, while a cell with the highest threshold usable in one embodiment represents a 00. In order to detect these levels a pair of sense amplifiers are utilized. A first amplifier 40 detects whether the charge stored fails above or below a first reference level which is essentially in the center of possible charges which might be stored. The output of this first sense amplifier is fed back and controls the next stage of detection. If the charge is below this level, the output of the first sense amplifier causes the output of the cell to be sent to a sense amplifier 46 and measured against a reference value midway between the 11 and 10 charge levels. If the charge is above the first level, the output of the first sense amplifier causes the output of the cell to be sent to the sense amplifier 46 and measured against a reference value midway between the 01 and 00 charge levels. The value of the reference is chosen in a select circuit by the output value produced by the first sense amplifier 40.

It will be noticed that the cells of the array may also be used to store a single bit. If the first sense amplifier 40 and the first reference value are used to measure the condition of the charge on the floating gate of the memory cell, the value of the charge will be above or below that of the reference cell and may indicate a 1 for an erased condition or a 0 for a programmed condition.

Memory cells are programmed in one embodiment by applying voltages to the gate and drain terminals of the memory cells while grounding the source terminals of those cells. In one embodiment, the sixteen bits of a word are stored in one operation. In order to conserve current in low power supply operations, four cells may be programmed at once, followed by four other cells, and so on in sequence until the word is programmed. If a cell stores a single bit, then in this embodiment, sixteen cells are used to store the word. If the cells store two bits each, then only eight cells are necessary to store the sixteen bits.

Those skilled in the art will recognize that it is quite difficult to program a plurality of flash EEPROM memory cells to different threshold levels during a series of continuing operation such as that described for multi-bit cells. The cells and other portions of the memory array circuitry are not and cannot be made to be identical. Consequently, the cells are never programmed at identical rates. In a one bit cell, then those cells being programmed may be charged to a level sufficiently beyond the reference level that all of the programmed states are reached without problems. However, if four multi-level cells are being programmed to different levels with different charge values by gradually raising the voltage placed on their gate terminals until each reaches its correct charge level, then the programming must be much more closely controlled so that the charge levels actually reached are within very limited ranges. Otherwise, some cells will not be charged sufficiently and others will be charged too far. Moreover, even though cells are charged to a sufficient level to provide a particular desired charge level when the cells are read, a verify operation necessary to ascertain that the charges fall within a proper range provides such a narrow range that it is possible for cells to program properly, yet lose a sufficient amount of that charge that they do not verify while other cells in the same word are still being charged. To charge the cells by an additional amount could be to potentially charge them beyond the proper level. Consequently, it is desirable to prevent those cells which have verified from reprogramming if they later fail to verify.

On the other hand, cells being programmed to the 00 state may program too rapidly because of their structure. Since the 00 state requires a charge sufficiently high in one embodiment that a somewhat greater charge would cause damage to the cell, it is desirable to restrain the charging of fast charging cells so that they do not overcharge when operated in the multi-bit mode.

One of the methods by which this is accomplished is to program the memory cells in steps. In order to accomplish this, the programming algorithm used by the controller during multi-bit programming applies a first initial pulse of a relatively long duration to the gate terminals of cells being programmed in order to move those cells into the saturation range of operation. In the saturation range, control of programming is relatively precise because a change in gate voltage will cause a similar change in the threshold voltage $V_t$ of the cell. Then each cell is checked to determine whether it has reached the desired state. If not, a pulse of a much shorter duration (one-quarter, in one embodiment) is applied to move the cell closer to its desired charge state. This pulse is at a slightly higher voltage. The charge level is again checked. Then the voltage is raised again and the shorter pulse again applied until the cell reaches a first charge level. When the cell reaches the first charge level, pulses of a much shorter length and the same voltage as the last pulse are applied to move the cell to the final charge level. Each of these latter pulses is just sufficient to move the cell within the limits to which its fits in the allowable range for the particular state so that no single pulse is capable of moving the cell beyond the desired range.

In order to bring about these desirable results, the present invention is utilized. The present invention is embodied in a verify circuit 30 which is described with respect to FIG. 6. The circuit 30 includes a pair of comparators 61 and 62 which compare the logic values of the sixteen bits of a word after each step of programming to determine if the particular desired levels of charge has been reached. The comparator 61 compares values when the memory cells 33 are used in their multi-bit states while the comparator 62 compares values when the memory cells 33 are used in their single bit states. Input to each comparator 61 and 62 is furnished from the array as a sixteen bit signal designated MEMDAT. The desired state to which each of the cells 33 is to be programmed is furnished by a multiplexor 63. The multiplexor provides sixteen bits of data from the user as a signal USERDAT or from a page buffer as a signal PAGEDAT. The desired data is transferred to each of the comparators 61 and 62 and to a multiplexor 65. The multiplexor 65 receives a control signal from the microcontroller 20 which allows the verify data or the user data to be transferred.

Figure 6:
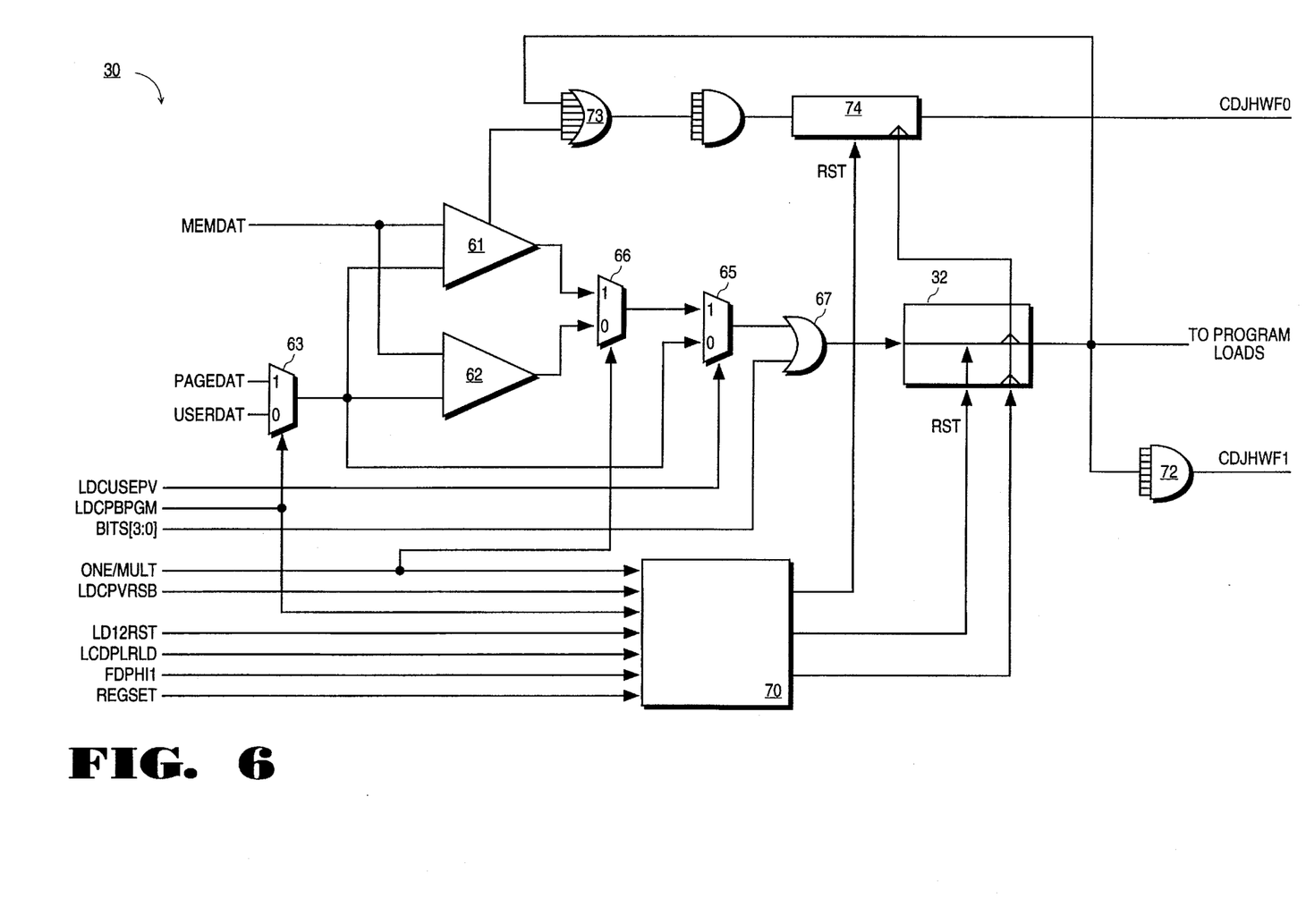
FIG. 6 is a detailed block diagram of a program verify circuit for a memory array in accordance with the present invention.

If the comparator 62 is in use because a single bit of data is being stored in each memory cell, then the output of the comparator 62 is transferred to a multiplexor 66 where it is selected by a control signal ONE/MULT indicating that the single bit mode is being utilized and transferred to the multiplexor 65. If the comparator 61 is in use because multiple bits of data are being stored in each memory cell, then the output of the comparator 61 is transferred to the multiplexor 66 where it is selected by the control signal ONE/MULT indicating that the multi-bit mode is being utilized and transferred to the multiplexor 65. The output from the comparator 61 is eight individual signals indicating for each cell whether the level stored in the cell compares with the two bits of the sixteen bits which are desired; this output is repeated on both the high and low eight bits provided by the multiplexor 66 at its output so that a total of sixteen signals is available. The output from either of the two comparators indicates for each particular memory cell 33 whether the state to which the cell should be programmed has been reached yet.

The output of the multiplexor 65 is furnished to an OR gate 67. The other input to the OR gate 67 is a signal BITS(3:0) which indicates the particular four bits being programmed. These bits allow less than all of the program load registers to be written at once. For example, in the current saving operation discussed above, only four bits are programmed at a time. Each of the four possible bits corresponds to four of the program load registers 32. The output of the OR gate 67 is transferred to the program load registers 32. The program load registers 32 are latches which store an indication whether the particular associated memory cell is to be programmed in the next step. The program load registers 32 are divided into two sets of eight registers each. If multi-level programming is taking place, then only eight cells can be verified at once and only half of these registers 32 are used. The proper register set used is activated in the page buffer mode by a two bit clock signal transferred from a logic circuit 70 and derived from the lowest order bit of the address used in addressing the array. In the single word programming mode, all sixteen registers are active but the registers are selected using the BITS[3:0] signal.

Each of the latches in the registers 32 stores a value and provides either a one or a zero as an output; a zero indicates that the associated cell should continue to be programmed, while a one indicates that the cell is not to be further programmed. A one is written to the latch for a particular cell 33 if the comparator 61 or 62 which is being used to determine whether the correct programming state has been reached indicates that, in fact, the state of the memory cell matches the desired state provided at the input to the multiplexor 63.

In order to assure that a cell which has once been programmed to the correct state (charge level) cannot be further programmed if charge leaks from the floating gate and the charge level fails below a level sufficient to verify the state, the latches each contain a feedback path which precludes a change of state once the charge level has been verified until the latch is reset. This is accomplished by prohibiting a zero indicating a failure to compare from being written to the latch once a one value has been written to the latch. A reset occurs only when a new programming operation is begun or when the programming of all cells to lower levels has been completed.

The output of each of the latches of the program load registers 32 is transferred to cause the drain voltages to be applied to the memory cells during programming the gate terminal of the column select transistor device 36 shown in FIG. 3 to select a particular column of the array so that particular flash EEPROM cell devices 33 are programmed. Those latches which provide a zero cause the column select transistor devices to be enabled while those that provide a one cause the column select transistor devices with which they are associated to be disabled.

In order to eliminate the problem of over charging, the outputs from each of the program load registers 32 are transferred to an AND gate 72. When the AND gate 72 receives one values from all of the registers 32, a signal CDJHWF1 is generated to indicate that the programming of the particular word has been completed. The outputs from each of the program load registers 32 are also transferred to an OR gate 73. Also transferred to the gate 73 are eight signals from the comparator 61 each of which indicates whether the two bits of the particular cell compare with the desired data. The OR gate 73 transfers the signals from the OR gate 73 to a level ½ flag circuit 74. The flag circuit indicates when each of the cells has been programmed to the 10 or 01 levels or when all of the program load registers provide a one value to indicate that the programming has been completed. The level ½ flag circuit 74 is used to prohibit over-programming when a cell has been programmed to a point just beyond the 01 level. This is accomplished by providing a reference cell which is charged to a level just beyond the level 01 but less than the level 00. This reference cell is used to test those cells which are being programmed to the 00 level to keep them from overcharging. This reference cell provides a confirmation that the memory cell has reached the 00 level before this has actually occurred. When the confirmation occurs, the program load register 32 for that cell 33 is disabled. Once all of the cells have been programmed to levels 10 and 01, the level ½ flag circuit is set so that the cells being programmed to the 00 level may continue programming. To allow this, the flag circuit and the program load registers associated with the cells being programmed to the 00 level are reset by signals from the logic circuit 70. This allows the continued programming of those memory cells which are being programmed to the 00 level. During this continued programming, a new reference cell is selected to provide a correct reference value for reaching the 00 level.

Figure 7:
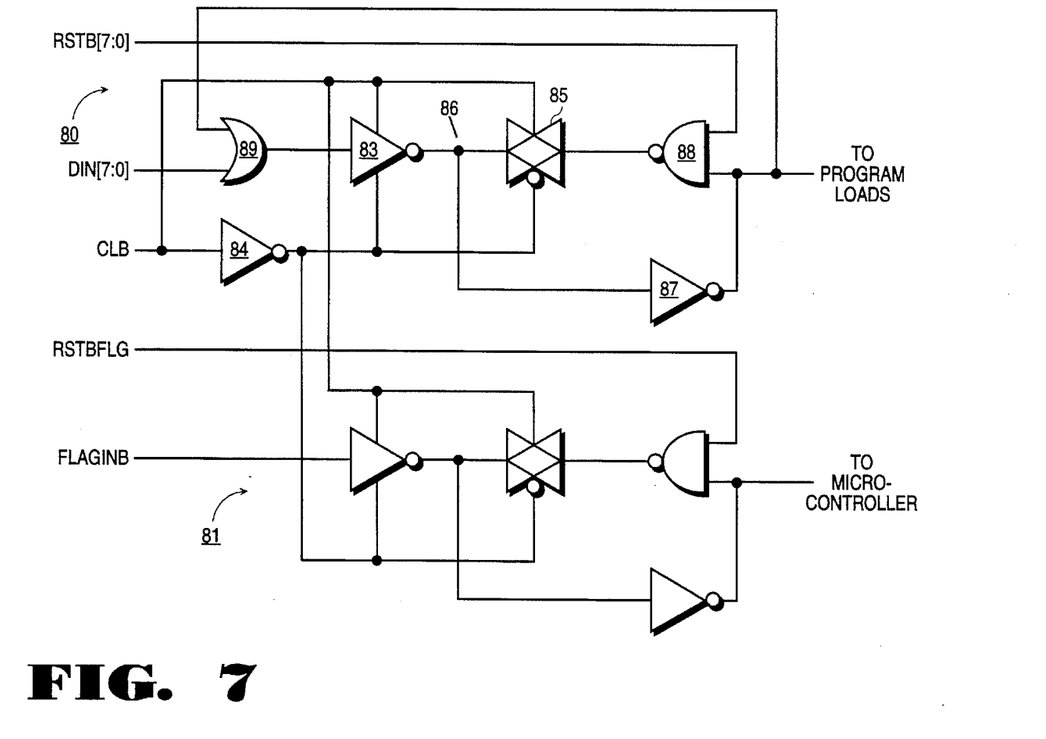
FIG. 7 is a circuit diagram illustrating a portion of the circuit of FIG. 6 in detail.

FIG. 7 is a circuit diagram illustrating the eight latches 80 (only one latch 80 is illustrated) used in the program load registers 32 and the flag circuit latch 81 associated with eight of the latches 80 as half of the program load registers 32. Although shown separated in FIG. 6, these circuits are part of the same integrated circuit in one embodiment. Each of the latches 80 and 81 receives a clock input signal CLB. The clock signal is inverted and transferred by an inverter 84 to gate the input to tristate inverters 83. The clock signal CLB is transferred directly to gate the input to transmission gates 85. Once the clock is removed from the tristate inverter 83, the transmission gate 85 provides feedback to maintain the node 86 in the desired condition. The tristate inverter 83 of each cell of the program load registers 32 receives one bit of the data signal DIN[7:0] indicating for each memory cell 33 whether the program level has been reached and clocks that signal to a node 86. This value is provided at the output of each of the program load registers 32 by an inverter 87. The value is inverted and transferred through a feedback path to the OR gate 89 so that the program load registers 32 cannot be placed in a condition to provide a zero output once any cell has been placed in a condition to provide a one value output. This eliminates the problem of memory cells which have been programmed to the proper level and later leaked charge (so that they no longer verify) being reprogrammed by the programing circuitry. A reset signal RSTB[7:0] is transferred by a NAND gate 88 and the transmission gate 85 to reset the state of the program load registers from a state at the node 86 which causes a memory cell to be further programmed. This reset signal is applied in two instances. The first is when the programing of the memory cells representing a word has been completed and the programming of a new word is to begin. This signal is initiated by the input signal LDCPVRSB from the microcontroller to the circuit 70. The second instance of the use of the reset signal RSTB(7:0) is to allow the programming signals to be provided once the 10 and 01 levels have been reached by all of the memory cells being programmed to those levels. In this second case, the output of the associated with the flag circuit latch 81 is transferred to the microcontroller 20 when that flag circuit latch receives an indication that all cells being programmed to the 10 and 01 levels have reached those levels. In this second instance, the reset signal RSTB(7:0) is generated only for those registers 32 which are to be programmed to the 00 level once all of the cells have reached the 01 level. This allows those memory cells being programmed to the 00 level to receive further programing pulses after all other cells have been raised to lower charge levels and eliminates over-programming.

The flag circuit latch 81 responds in a similar manner to the signal FLAGINB and a flag reset signal RSTBFLG. The signal FLAGINB is produced when all of the memory cells which are being programmed to the 10 and 01 states have been programmed to 10 and 01 conditions. The flag reset signal RSTBFLG is generated and causes the microcontroller 20 to generate the signal LD12RST which causes the circuit 70 to initiate the reset signal RSTB[7:0] when the latches of the registers 32 being programmed to the 00 level are reset.

These program load registers 32 and the associated flag circuits provide the desirable ability by which the invention is able to overcome the problems associated with over-programming and leakage from the memory cell when it has already reached a correct programming level. The circuitry also provides a hardware means of verifying the programming of the plurality of levels to which the memory cells are being programmed in a very few cycles. This makes the verify operation much faster than has been possible with prior art software verify processes. The hardware process disclosed herein accomplishes the verify operation in approximately two microcode cycles required by the microcontroller 20 to accomplish its operation. For some of the verify operations, especially those involving multi-level programming, the hardware verification is an order of magnitude faster than software verification would be. For example, in order to verify in software where only a one bit is stored for each memory cell, first data in the cell must be accessed, then the desired data must be accessed, then the data must be compared, then the program load circuits must be written to for those cells to be programmed. Each of these steps requires a microcode cycle. Verifying where multi-level storage is involved requires many more cycles to accomplish.

Figure 8:
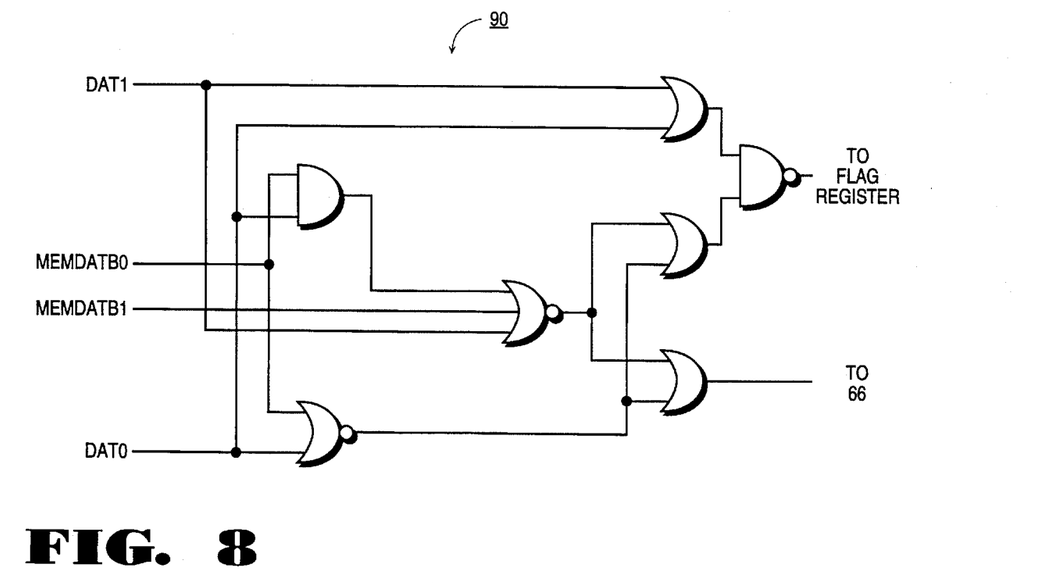
FIG. 8 is a circuit diagram illustrating another portion of the circuit of FIG. 6 in detail.

FIG. 8 illustrates a circuit 90 which may be utilized to provide the comparison of the levels to which the memory cells are being programmed and the present state of each of the cells 33. The circuit 90 may be duplicated for each of the memory cells and used, for example, as the comparator 61. The circuit 90 receives two bits of data indicated as DAT0 and DAT1 which indicate the two bits to which the cells should be programmed and two more bits of data MEMDATB0 and MEMDATB1 which indicate the current state of the memory cells. For each of the cells 90, the values of the data are compared and a flag signal FLAG is provided. A zero is provided as a flag bit if the two desired bits are not the same as the two actual bits. When the two desired bits are the same as the actual bits, a one is provided as a flag bit output. This value is inverted and the summed flag signals are transferred via the OR gate 73 arrangement of FIG. 6 to the flag register as the FLAGINB signal. A second output of the circuit 90 is transferred by the multiplexors 66 and 65 and the OR gate 67 as the various DIN[7:0] signals and utilized in the manner described above when the desired charge level is reached. Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A programming verify circuit for controlling the application of programming voltages to a plurality of memory cells in a flash EEPROM memory array, each of the memory cells capable of storing a plurality of states, the circuit comprising:

a comparator for testing a current state of each memory cell being programmed with a state to which the memory cell is to be programmed, and a program load circuit coupled to the comparator, storing for each memory cell a value output from the comparator indicating whether the memory cell should be further programmed, the program load circuit including circuitry for precluding storing for each memory cell a value indicating further programming of the memory cell is necessary once the memory cell has been initially verified by the comparator as programmed.

2. The programming verify circuit of claim 1 wherein the circuitry for precluding storing for each memory cell a value comprises a latch and a feedback circuit for controlling input to the latch depending on the state of the latch when the value output from the comparator is applied.

3. The programming verify circuit of claim 1 further comprising a flag circuit for prohibiting overprogramming of a memory cell.

4. The programming verify circuit of claim 3 wherein the flag circuit comprises a register for receiving input from the program load circuit indicating whether a memory cell is programmed or to be programmed.

5. The programming verify circuit of claim 3 further comprising a controller circuit for resetting the program load circuit and the flag circuit.

6. A computer system comprising:

a computer bus, a central processor coupled to the computer bus, a flash EEPROM memory array coupled to the computer bus comprising:

a plurality of memory cells arranged in rows and columns, each of the memory cells capable of assuming a plurality of states, a programming verify circuit for controlling the application of programming voltages to the memory cells, the circuit comprising:

a comparator for testing a current state of each memory cell being programmed with a state to which the memory cell is to be programmed, and a program load circuit coupled to the comparator, storing for each memory cell a value output from the comparator indicating whether the memory cell should be further programmed, the program load circuit including circuitry for precluding storing for each memory cell a value indicating further programming of the memory cell is necessary once the memory cell has been initially verified by the comparator as programmed.

7. The computer system of claim 6 wherein the circuitry for precluding storing for each memory cell a value comprises a latch and a feedback circuit for controlling input to the latch depending on the state of the latch when the value output from the comparator is applied.

8. The computer system of claim 6 further comprising a flag circuit for prohibiting overprogramming of a memory cell.

9. The computer system of claim 8 wherein the flag circuit comprises a register for receiving input from the program load circuit indicating whether a memory cell is programmed or to be programmed.

10. The computer system of claim 8 further comprising a controller circuit for resetting the program load circuit and the flag circuit.

11. A programming verify circuit for controlling the application of programming voltages to a plurality of memory cells in a memory array, each of the memory cells capable of storing a plurality of data bits, the circuit comprising:

comparator means for testing a current state of each memory cell being programmed with a state to which the memory cell is to be programmed, and storing means coupled to the comparator means for storing for each memory cell a value output from the comparator means indicating whether the memory cell should be further programmed, the storing means including means for precluding storing for each memory cell a value indicating further programming of the memory cell is necessary once the memory cell has been initially verified by the comparator means as programmed.

12. The programming verify circuit of claim 11 wherein the means for precluding storing for each memory cell a value comprises a latch and a feedback circuit for controlling input to the latch depending on the state of the latch when the value output from the comparator means is applied.

13. The programming verify circuit of claim 11 further comprising means for prohibiting overprogramming of a memory cell.

14. The programming verify circuit of claim 13 wherein the means for prohibiting overprogramming of a memory cell comprises a register for receiving input from the storing means indicating whether a memory cell is programmed or to be programmed.

15. The programming verify circuit of claim 13 further comprising a controller circuit for resetting the storing means and the means for prohibiting overprogramming of a memory cell.

16. A computer system comprising:

computer bus means, central processing means coupled to the computer bus means, a memory array coupled to the computer bus means comprising:

a plurality of memory cells arranged in rows and columns, each of the memory cells capable of storing a plurality of states, comparator means for testing a current state of each memory cell being programmed with a state to which the memory cell is to be programmed, and storing means coupled to the comparator means for storing for each memory cell a value output from the comparator means indicating whether the memory cell should be further programmed, the storing means including means for precluding storing for each memory cell a value indicating further programming of the memory cell is necessary once the memory cell has been initially verified by the comparator means as programmed.

17. The computer system of claim 16 wherein the means for precluding storing for each memory cell a value comprises a latch and a feedback circuit for controlling input to the latch depending on the state of the latch when the value output from the comparator means is applied.

18. The computer system of claim 16 further comprising means for prohibiting overprogramming of a memory cell.

19. The computer system of claim 18 wherein the means for prohibiting overprogramming of a memory cell comprises a register for receiving input from the storing means indicating whether a memory cell is programmed or to be programmed.

20. The computer system of claim 18 further comprising a controller circuit for resetting the storing means and the means for prohibiting overprogramming of a memory cell.

* * * * *

UNITED STATES PATENT AND TRADEMARK OFFICE
CERTIFICATE OF CORRECTION

PATENT NO. : 5,523,972  Page 1 of 2
DATED : June 4, 1996
INVENTOR(S) : Rashid et al.

It is certified that error appears in the above-identified patent and that said Letters Patent is hereby corrected as shown below:

In column 2 at line 28 delete "programing" and insert --programming--

In column 2 at line 56 delete "programing" and insert --programming--

In column 3 at line 1 delete "programing" and insert --programming--

In column 5 at line 2 delete "*Circuit*" and insert --*Circuitry*--

In column 6 at line 59 delete "fails" and insert --falls--

In column 7 at line 21 delete "programed" and insert --programmed--

In column 8 at line 1 delete "programing" and insert --programming--

In column 9 at line 24 delete "fails" and insert --falls--

In column 10 at line 37 delete "programing" and insert --programming--

In column 10 at line 42 delete "programing" and insert --programming--

UNITED STATES PATENT AND TRADEMARK OFFICE
CERTIFICATE OF CORRECTION

PATENT NO.   :   5,523,972

DATED        :   June 4, 1996

INVENTOR(S)  :   Rashid et al.

It is certified that error appears in the above-identified patent and that said Letters Patent is hereby corrected as shown below:

Column 10, line 58, delete "programing" and insert --programming--.

Signed and Sealed this

Twenty-fifth Day of February, 1997

Attest:

BRUCE LEHMAN

*Attesting Officer*     *Commissioner of Patents and Trademarks*